(12) United States Patent
Crippa et al.

(10) Patent No.: US 7,349,265 B2
(45) Date of Patent: Mar. 25, 2008

(54) READING METHOD OF A NAND-TYPE MEMORY DEVICE AND NAND-TYPE MEMORY DEVICE

(75) Inventors: Luca Crippa, Busnago (IT); Chiara Missiroli, Concorezzo (IT); Rino Micheloni, Turate (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 39 days.

(21) Appl. No.: 11/458,916

(22) Filed: Jul. 20, 2006

(65) Prior Publication Data

US 2007/0047316 A1    Mar. 1, 2007

(30) Foreign Application Priority Data

Jul. 22, 2005   (EP)   ................................. 05106782

(51) Int. Cl.
*G11C 16/06* (2006.01)
(52) U.S. Cl. ............................ 365/185.21; 365/185.17; 365/185.18; 365/185.25
(58) Field of Classification Search ............ 365/185.21
See application file for complete search history.

(56) References Cited

U.S. PATENT DOCUMENTS

| | | | |
|---|---|---|---|
| 6,175,522 B1 * | 1/2001 | Fang | 365/185.18 |
| 6,567,305 B2 * | 5/2003 | Nakamura | 365/185.11 |
| 6,982,905 B2 * | 1/2006 | Nguyen | 365/185.17 |
| 7,203,092 B2 * | 4/2007 | Nazarian | 365/185.17 |
| 2005/0078518 A1 | 4/2005 | Nguyen | 365/185.17 |
| 2007/0133288 A1 * | 6/2007 | Iwai et al. | 365/185.17 |

* cited by examiner

*Primary Examiner*—Son L. Mai
(74) *Attorney, Agent, or Firm*—Lisa K. Jorgenson; Robert Iannucci; Seed IP Law Group PLLC

(57) ABSTRACT

A reading method of a NAND memory device includes the steps of first connecting a first end terminal of a stack of cells to a reference line, second connecting a second end terminal of the stack of cells to a respective bitline, and charging the bitline to a predetermined bitline read voltage, where one of the steps of first connecting and second connecting is carried out before charging the bitline and the other of the steps of first connecting and second connecting is carried out after charging the bitline. An order of carrying out the steps of first connecting and second connecting is determined based on an address of a selected cell.

30 Claims, 16 Drawing Sheets

READING METHOD OF A NAND-TYPE MEMORY DEVICE AND NAND-TYPE MEMORY DEVICE

BACKGROUND OF THE INVENTION

1. Field of the Invention

The present invention relates to a reading method of a NAND-type memory device and to a NAND-type memory device.

2. Description of the Related Art

Minimizing the size of the devices is a major target to be achieved in the design of nonvolatile memories, as well as in almost all electronic applications. However, the reduction of the dimensions often involves problems that may not be disregarded, especially in some kinds of nonvolatile memories, such as NAND-type nonvolatile memory devices (NAND memories hereinafter).

A conventional NAND memory architecture will be described hereinafter, in order to focus on problems that increased and undesired capacitive coupling due to component miniaturization may cause.

As shown in FIG. 1, a NAND memory 1 comprises an array 2 of cells 3 arranged in rows and columns, an I/O buffer 4, a row decoder circuit 5, a column decoder circuit 6, a sensing stage 7, a regulated voltage generator 8 and a control unit 9. We will initially assume that cells 3 are single level flash memory cells, capable of storing one bit each. FIG. 2 shows the distribution of the threshold voltages corresponding to an erased state (1, negative threshold voltage $V_T$) and to a programmed state (0, positive threshold voltage $V_T$) for a cell 3. With reference to FIG. 3, cells 3 arranged on a same column are associated to a same bitline 10. More precisely, cells 3 of a same column are series connected in groups, normally of 16 or 32 elements, to form so-called strings or stacks, which are indicated by the reference number 12 in FIG. 3. First end terminals 12a of the stacks 12 are selectively connectable to a common ground line 13 through respective source selectors 15; and second end terminals 12b of the stacks 12 are selectively connectable to the respective bitline 10 through respective drain selectors 16. In the embodiment herein described, source selectors 15 and drain selectors 16 are NMOS transistors. Of course, stacks 12, source selectors 15 and drain selectors 16 are arranged in rows and columns. So, source selectors 15 arranged on a same row have their gate terminals connected to a same source select line 18 and drain selectors 16 arranged on a same row have their gate terminals connected to a same drain select line 19. Moreover, couples of adjacent bitlines 10 (one even and one odd) are connected to a respective page buffer circuit 20 in the sensing stage 7.

Gate terminals of cells 3 arranged on a same row are connected to a same wordline. In FIG. 3, wordlines are designated by symbols WL<M-1,N>, WL<M,N> where M designates a row of stacks 12 in the array 2 and N designates the position of a wordline in the respective row of stacks 12. In the example of FIG. 3, each stack 12 includes 32 cells 3, so N ranges from 0 to 31. So, in the M-th row of stacks 12, WL<M,0> designates the wordline coupled to the cells 3 having their source terminals directly connected to the respective source selectors 18, and WL<M,31> designates the wordline coupled to the cells 3 having their drain terminals directly connected to the respective drain selectors 19. There may be sixteen rows of stacks 12, for example.

NAND memory reading is usually based on charge integration and exploits the parasitic capacitance $C_P$ associated to each bitline 10 (illustrated by parasitic capacitors 21 in FIG. 3). When a cell 3 is selected for reading, the page buffer circuit 20 supplies an precharge current $I_{PC}$ to the corresponding bitline 10, until the parasitic capacitors 21 is charged to a predetermined drain read voltage $V_{DR}$ (e.g., 1.2 V to 1.4 V). Moreover, a gate read voltage $V_{GR}$ is provided on the wordline WL<M,N> coupled to the gate terminal of the selected cell 3, whereas wordlines coupled to the other cells 3 in the same stack 12 are set to a pass voltage $V_P$. The gate read voltage $V_{GR}$ has such a value that the corresponding selected cell 3 may draw a current only in the erased state, but not in the programmed state. In other words, the gate read voltage $V_{GR}$ is intermediate between admissible threshold voltage levels corresponding to the erased state and to the programmed state. In the example of FIG. 2, $V_{GR}$ is 0 V. The pass voltage $V_P$ is as high as to turn on the corresponding cells 3 independently of their state (e.g., $V_P$=5.5 V). Hence, all of the cells 3 which receive the pass voltage $V_P$ via the respective wordlines WL<M,N> are operated as pass gates.

During the step of charging the bitline 10, current is prevented from flowing through the selected stack 12 (i.e., the stack 12 including the selected cell 3) by turning off the respective source selector 15. To this end, a source control voltage $V_{SS}$ on the source select line 18 is set to 0 V. Instead, a drain control voltage $V_{DS}$ on the drain select line 19 is set to an appropriate voltage, so as to keep the drain selector 16 on (e.g., $V_{DS}$=5.5 V).

When the bitline 10 has been charged to the drain read voltage $V_{DR}$, the source selector 15 is turned on by raising the source control voltage $V_{SS}$ to an appropriate level (e.g., 4.5 V). Thus, the charge stored on the parasitic capacitor 21 associated to the selected bitline 10 is sunk by the selected cell 3, provided that the selected cell 3 is in the erased state. In this case, the voltage on the selected bitline 10 drops to substantially 0 V. If, on the contrary, the selected cell 3 is in the programmed state, no currents may flow and the voltage on the selected bitline 10 remains substantially unchanged. The page buffer circuit 20 then senses the voltage level on the selected bitline and provides output data, which is sent to the I/O buffer 4 through the column decoder circuit 6.

Problems may arise when a cell 3 is selected for reading, which is coupled to the wordline WL<M-1,0>, WL<M,0>, i.e., the closest wordline to the source select line 18 in the respective row of stacks 12. In fact, capacitive coupling is established between adjacent conductive lines, either wordlines WL<M,N>, source select lines 18 or drain select lines 19. Moreover, the closer the conductive lines are arranged, the stronger the capacitive coupling. By currently available semiconductor technologies, NAND memories may be made wherein conductive lines are spaced apart 100 nm only, i.e., approximately equal to the width of the conductive lines themselves. Thus, when the source control voltage $V_{SS}$ on the source select line 18 is raised after charging the selected bitline 10, the capacitive coupling produces a voltage swing on the adjacent wordline WL<M,0>, as shown in FIG. 4. The voltage swing may temporarily turn on the selected cell 3, even if the latter is in the programmed state. Therefore, the selected bitline 10 is discharged independently of the state of the selected cell 3 and a reading error occurs. The above described drawback is becoming increasingly important as the size of the NAND memories is reduced, and affects multilevel even more seriously. In multilevel memories, in fact, threshold voltage levels associated to different programming states and the corresponding gate reading voltage are separated by narrower gaps, as compared to single level memories, as shown in FIG. 5. Thus, even a small voltage swing caused by raising the source control voltage $V_{SS}$ may cause the actual voltage on the wordline WL<M,0> to depart from a nominal gate reading voltage, corresponding to a threshold voltage level, to such an extent that the selected cell 3 is turned on irrespective of its programming state. Therefore, reading errors may occur.

BRIEF SUMMARY OF THE INVENTION

According to an embodiment of the present invention, a reading method of a NAND memory device includes the steps of first connecting a first end terminal of a stack of cells to a reference line, second connecting a second end terminal of the stack of cells to a respective bitline, and charging the bitline to a predetermined bitline read voltage, where one of the steps of first and second connecting is carried out before charging the bitline and the other of the steps of first and second connecting is carried out after charging the bitline. The reading method further includes the step of determining an order of carrying out the steps of first and second connecting, based on an address of a selected cell.

According to an embodiment of the present invention, a NAND memory device includes at least one stack of cells having first and second end terminals, where the first and second end terminals are selectively connectable to a reference line and a bitline, respectively. The NAND memory device further includes a sensing circuit coupled to the bitline for charging the bitline to a predetermined bitline read voltage and a control unit. The control unit is configured for connecting one of the first and second end terminals before charging the bitline and the other of the first and second end terminals after charging the bitline. The control unit is further configured for determining an order of connecting the first and second end terminals, based on an address of a selected cell.

BRIEF DESCRIPTION OF THE SEVERAL VIEWS OF THE DRAWING(S)

For an understanding of the present invention, preferred embodiments thereof are now described, purely as non-limitative examples, with reference to the enclosed drawings, wherein.

DETAILED DESCRIPTION OF THE INVENTION

Figure 5:
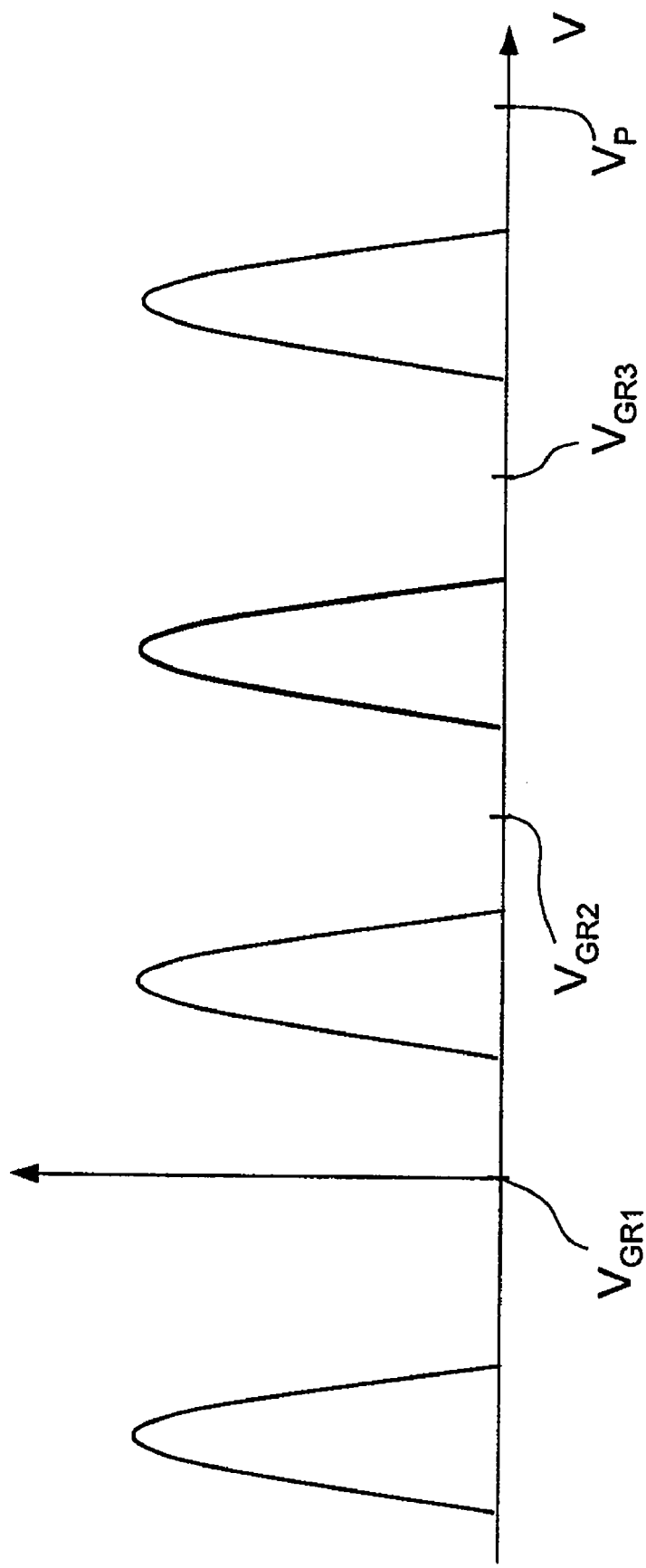
FIG. 5 is a plot of quantities relating to multilevel memory cells.
Figure 6:
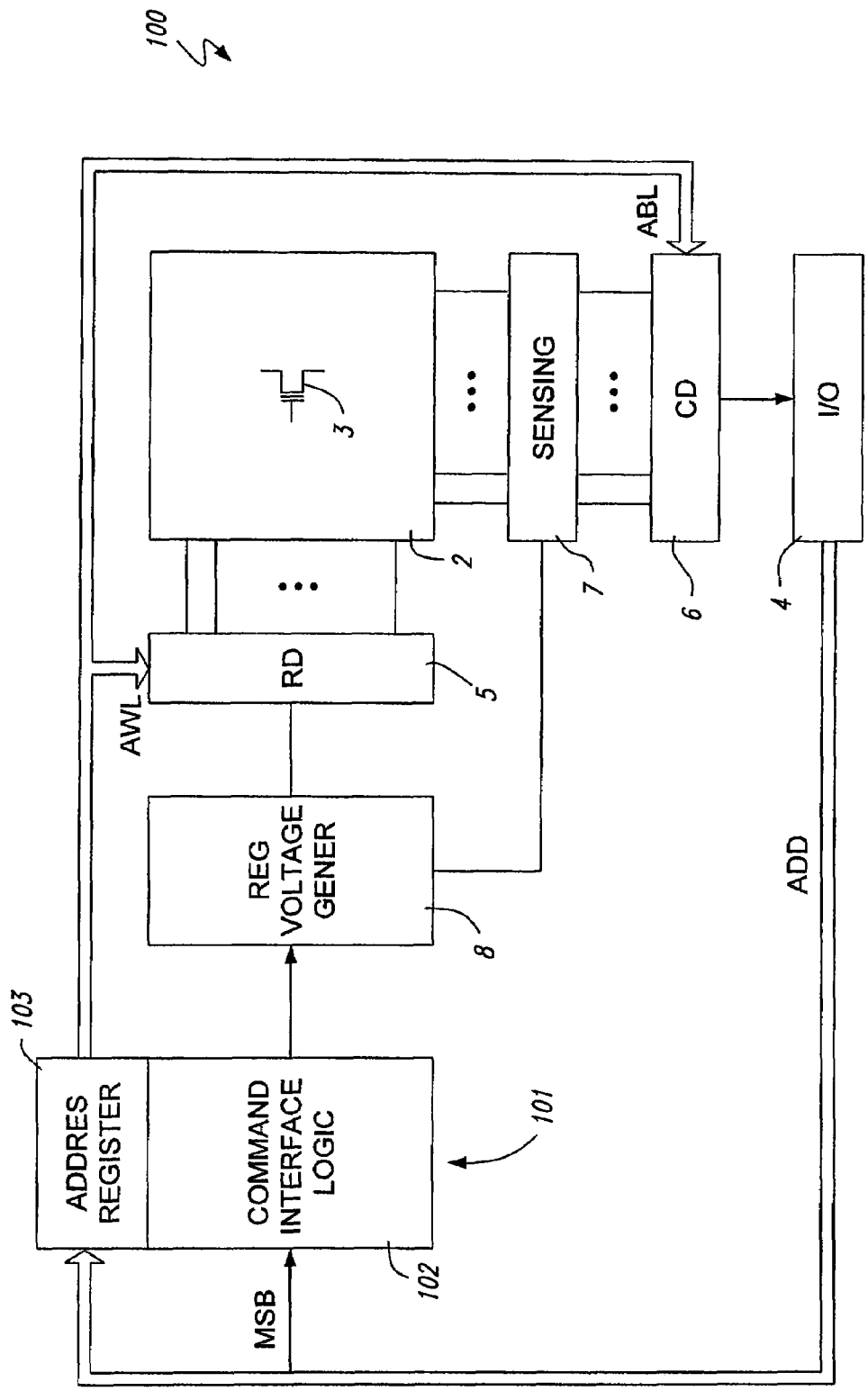
FIG. 6 is a simplified block diagram of a NAND memory device according to an embodiment of the present invention.
Figure 7:
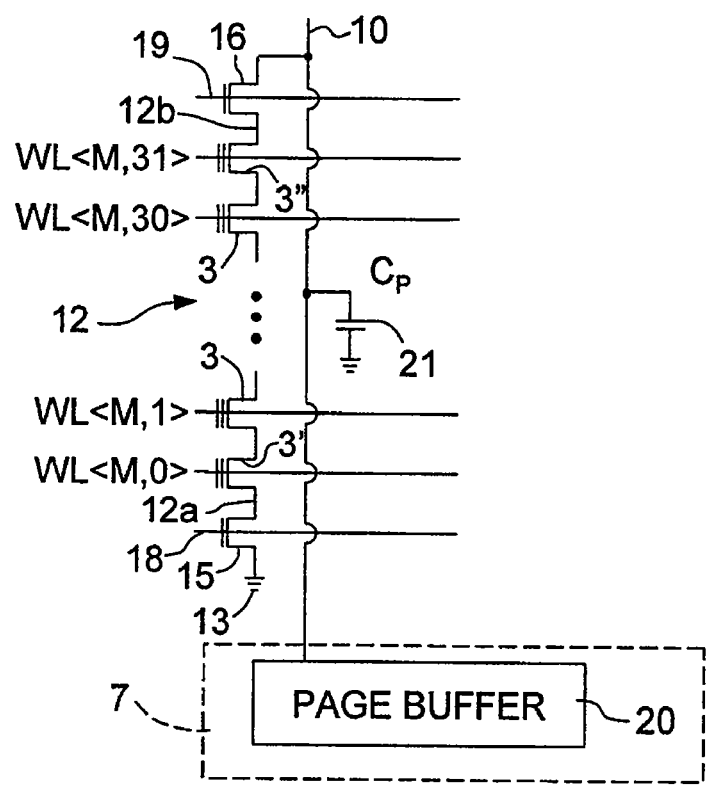
FIG. 7 is a simplified electric diagram of a portion of the NAND memory device of FIG. 6.

FIGS. 6 and 7, where parts already illustrated in the previous figures are designated by the same reference numbers, show a NAND memory device 100 including the array 2 of cells 3, the I/O buffer 4, the row decoder circuit 5, the column decoder circuit 6, the sensing stage 7, the regulated voltage generator 8 and a control unit 101. The cells 3 are multilevel flash memory cells, capable of storing two bits each, and have the threshold voltage distribution illustrated in FIG. 5. In particular, three different gate read voltages $V_{GR1}$, $V_{GR2}$, $V_{GR3}$ are used to discriminate the programming state of each cell 3. In alternative embodiments of the invention, cells 3 are either single level nonvolatile cells, capable of storing one bit each, or multilevel cells capable of storing more than two bits.

Figure 1:
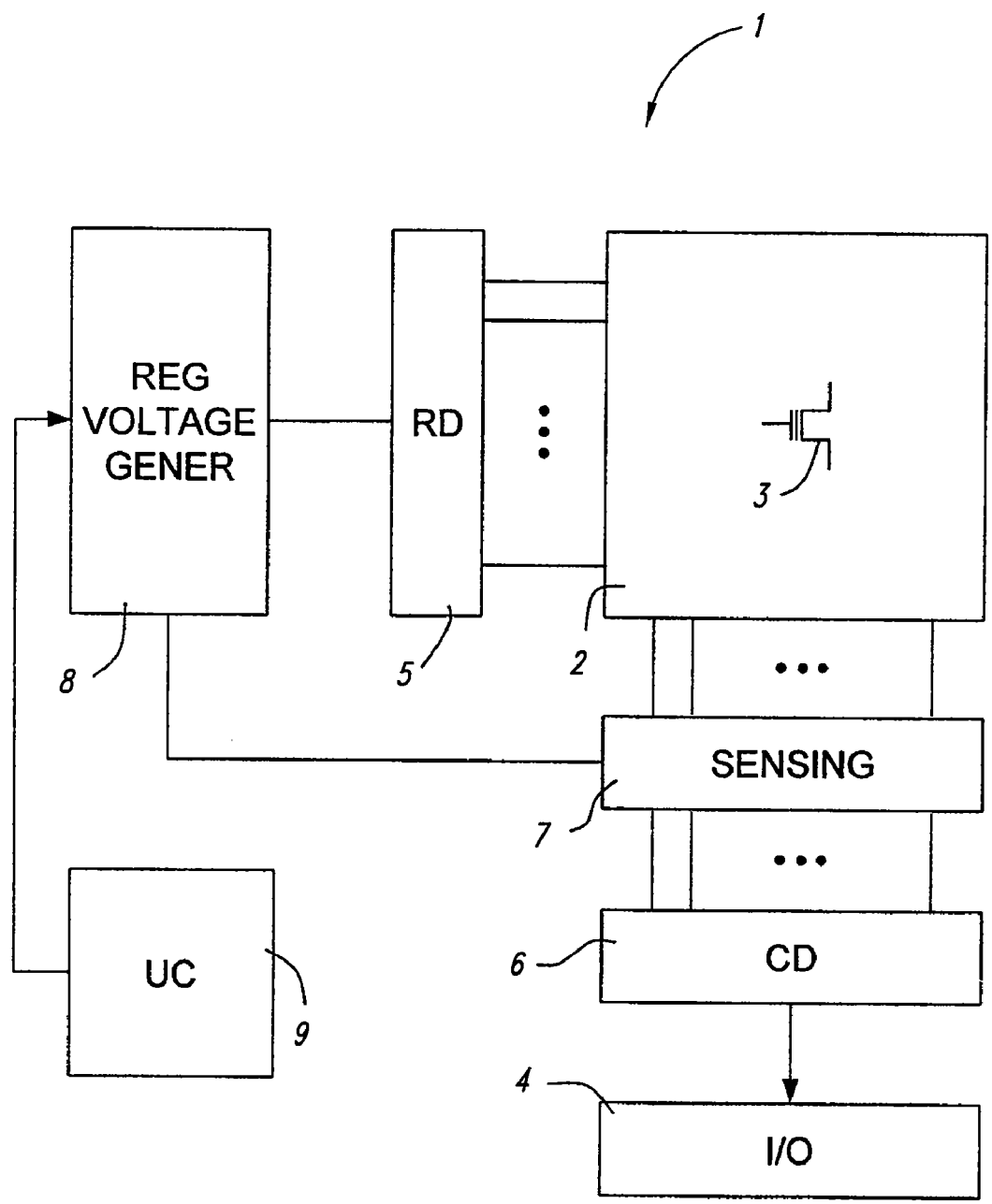
FIG. 1 is a simplified block diagram of a known NAND memory device.
Figure 2:
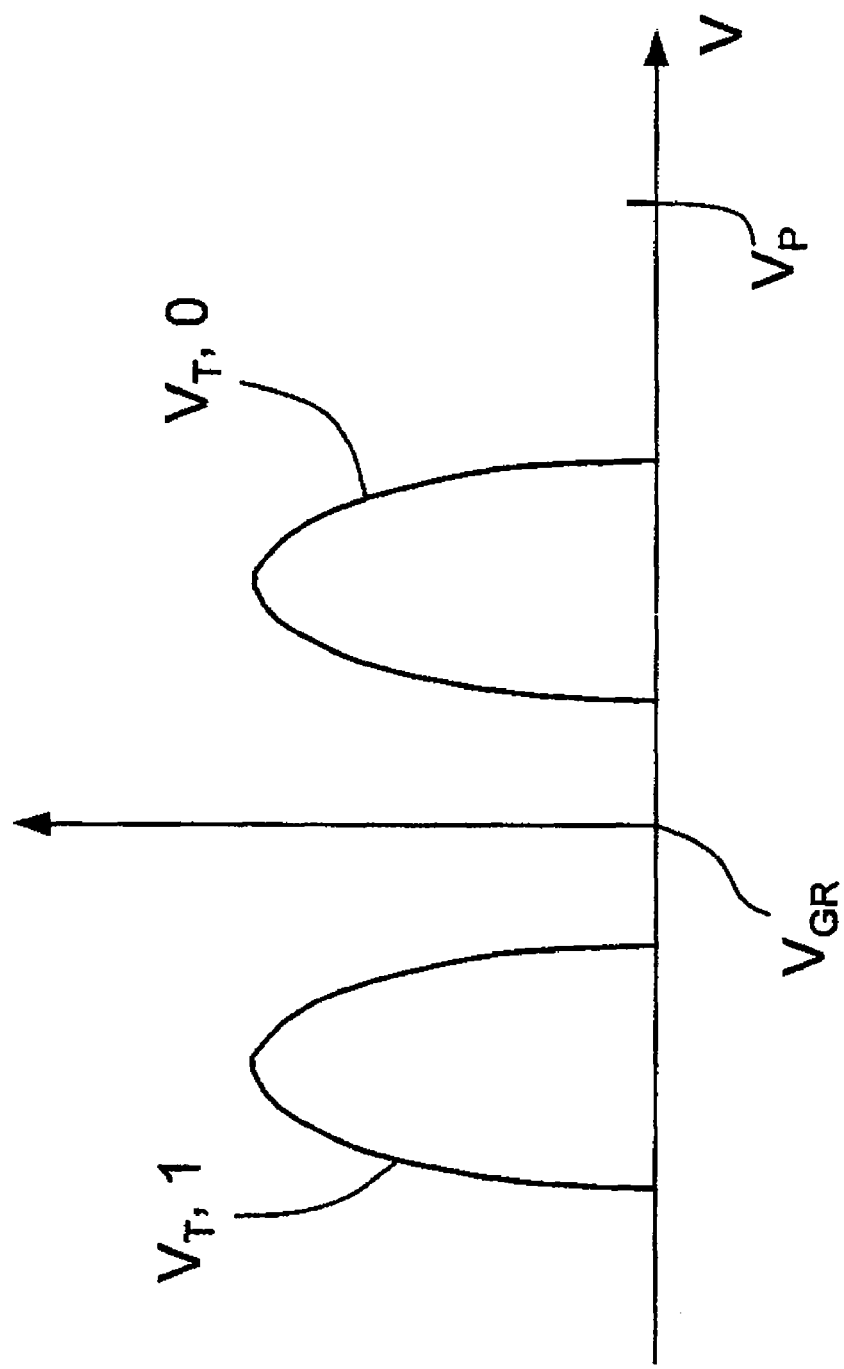
FIG. 2 is a plot of quantities relating to single level memory cells.
Figure 3:
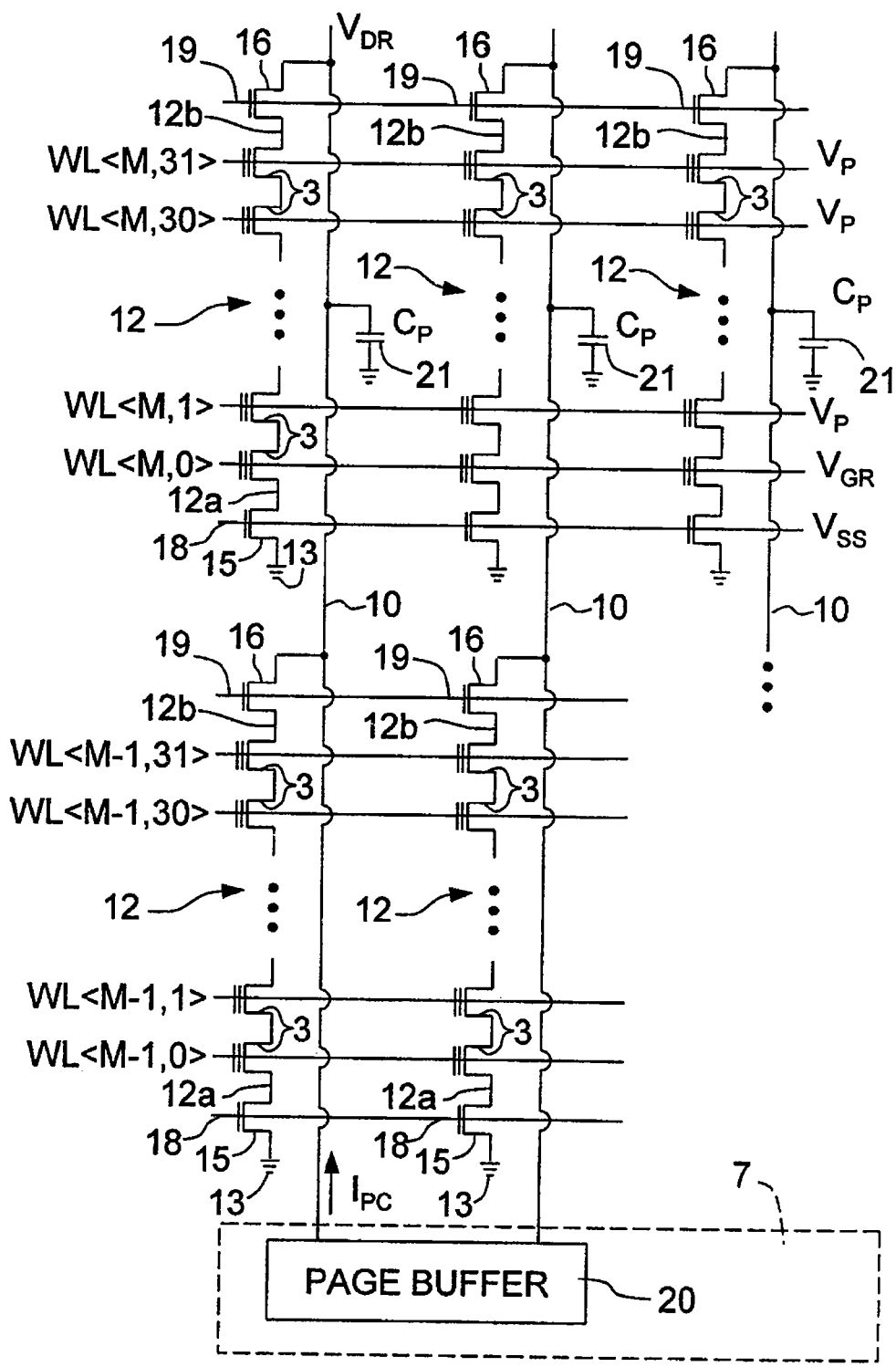
FIG. 3 is a simplified electric diagram of a portion of the NAND memory device of FIG. 1.
Figure 4:
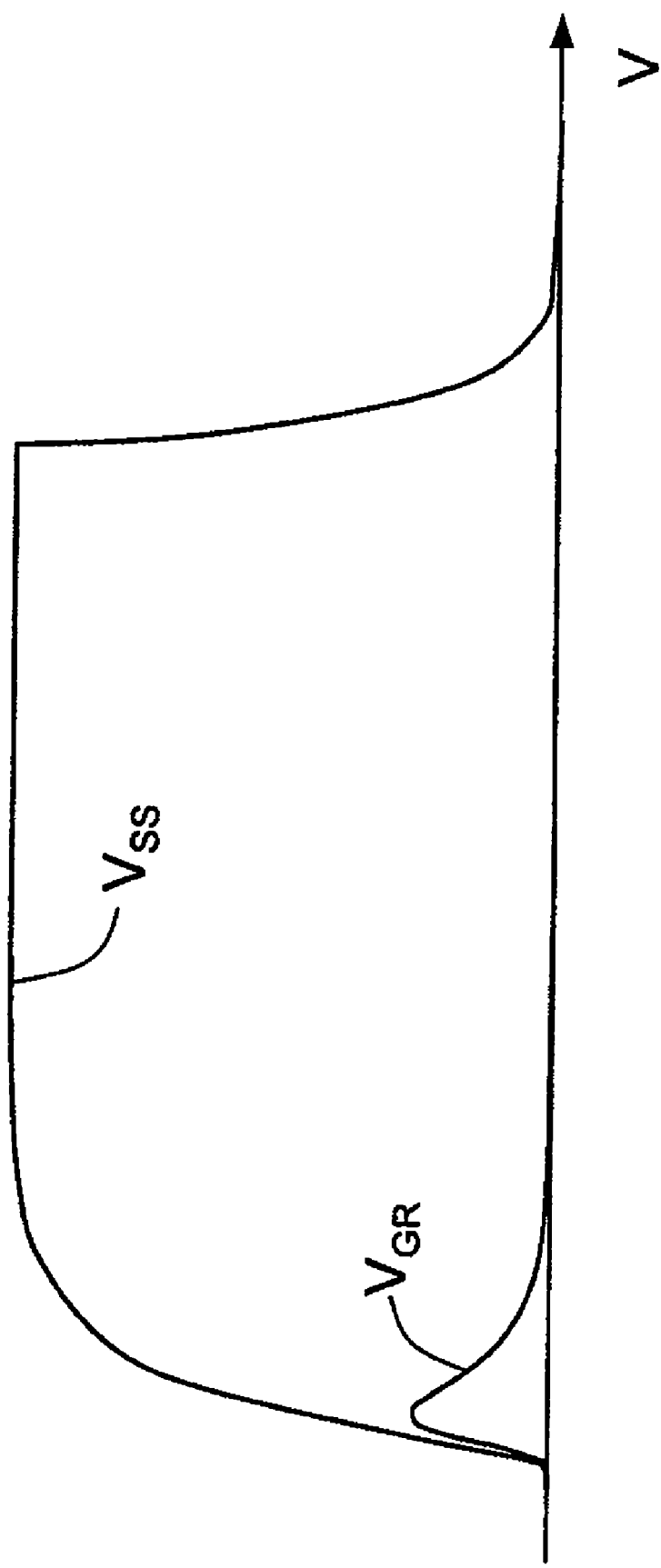
FIG. 4 is a plot of quantities relating to the NAND memory device of FIG. 1.

Cells 3 are arranged in rows and columns and organized in stacks 12 of e.g., 32 elements in one embodiment, as already explained with reference to FIG. 3. FIG. 7 shows one stack 12 in a M-th row of stacks 12 (only partially sketched) and the respective source selector 15, drain selector 16, source select line 18 and drain select line 19. The first end terminal 12a and the second end terminal 12b of the stack 12 are formed by the source terminal of a first cell 3' coupled to the wordline WL<M,0> and by the drain terminal of a second cell 3" coupled to the wordline WL<M,31>, respectively.

The control unit 101 (FIG. 6) includes a command interface logic 102 and an address register 103.

Figure 8:
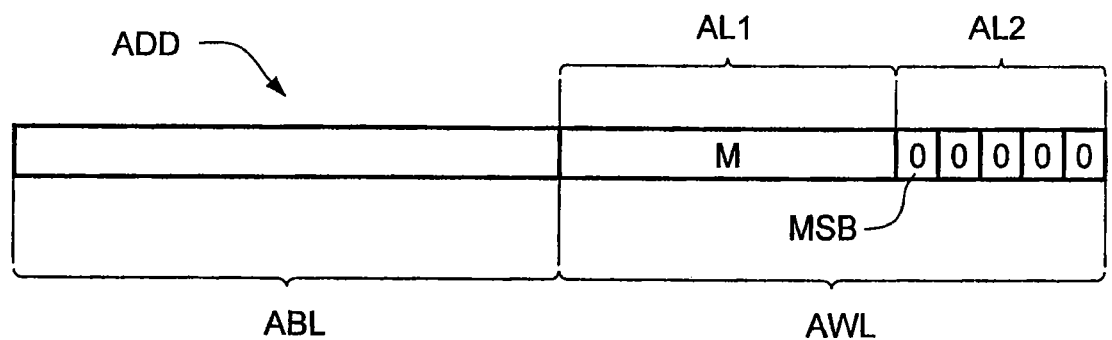
FIG. 8 is a logic diagram of an address used for selecting cells in the NAND memory device of FIG. 6.

The I/O buffer 4 is coupled to an address bus (not shown) for receiving addresses ADD of cells 3 to be selected for R/W operations. An address ADD includes a wordline address section AWL and bitline address section ABL, as illustrated in FIG. 8 (namely, FIG. 8 shows the address ADD of a cell 3 connected to the wordline WL<M,0>). In turn the wordline address selection AWL comprises a first level section AL1 and a second level section AL2. The first level section AL1 is used for selecting a row of stacks 12, whereas the second level section AL2 designates a single wordline WL<M,0>, WL<M,1>, ..., WL<M,31> in the selected row of stacks 12. In the embodiment herein described, the second level section AL2 includes five bits.

As illustrated in FIG. 6, during reading operations any address ADD received in the I/O buffer 4 is sent to the address register 103 of the control unit 101, which supplies the wordline address section AWL and the bitline address section ABL to the row decoder circuit 5 and to the column decoder circuit 6, respectively. Moreover, a most significant bit MSB of the second level section AL2 (FIG. 8) is provided to the command interface logic 102.

The command interface logic 102 is configured for biasing the wordlines WL<M,0>, WL<M,1>, ..., WL<M,31> according to the wordline address section AWL supplied through the I/O buffer 4 and for controlling the source selector 15 and the drain selector 16 based on the wordline address section AWL, in particular based on the most significant bit MSB of the second level section AL2. Appropriate voltage levels are supplied to the wordlines WL<M, 0>, WL<M,1>, ..., WL<M,31>, the source select line 18 and the drain select line 19 by controlling the regulated voltage generator 8.

Operation of the NAND memory 100 will be hereinafter explained with reference to the flow chart of FIG. 9 and moreover to FIGS. 10-13, where the source selector 15 and the drain selector 16 are represented by the symbols of switches.

When a read operation is requested (block 1000 FIG. 9), an address ADD is loaded in the I/O buffer 4 from outside and sent to the address register 103, which supplies the wordline address section AWL and the bitline address section ABL to the row decoder circuit 5 and to the column decoder circuit 6, respectively. Moreover, the most significant bit MSB is supplied to the command interface logic 102. We will assume that a cell 3 is selected in the M-th row of stacks 12.

Then, the most significant bit MSB is tested (block 1100) to assess whether the selected cell 3 is coupled to a wordline in the group WL<M,0>, ..., WL<M,15> (MSB=0) or to a wordline in the group WL<M,16>, ..., WL<M,31> (MSB=1).

Figure 9:
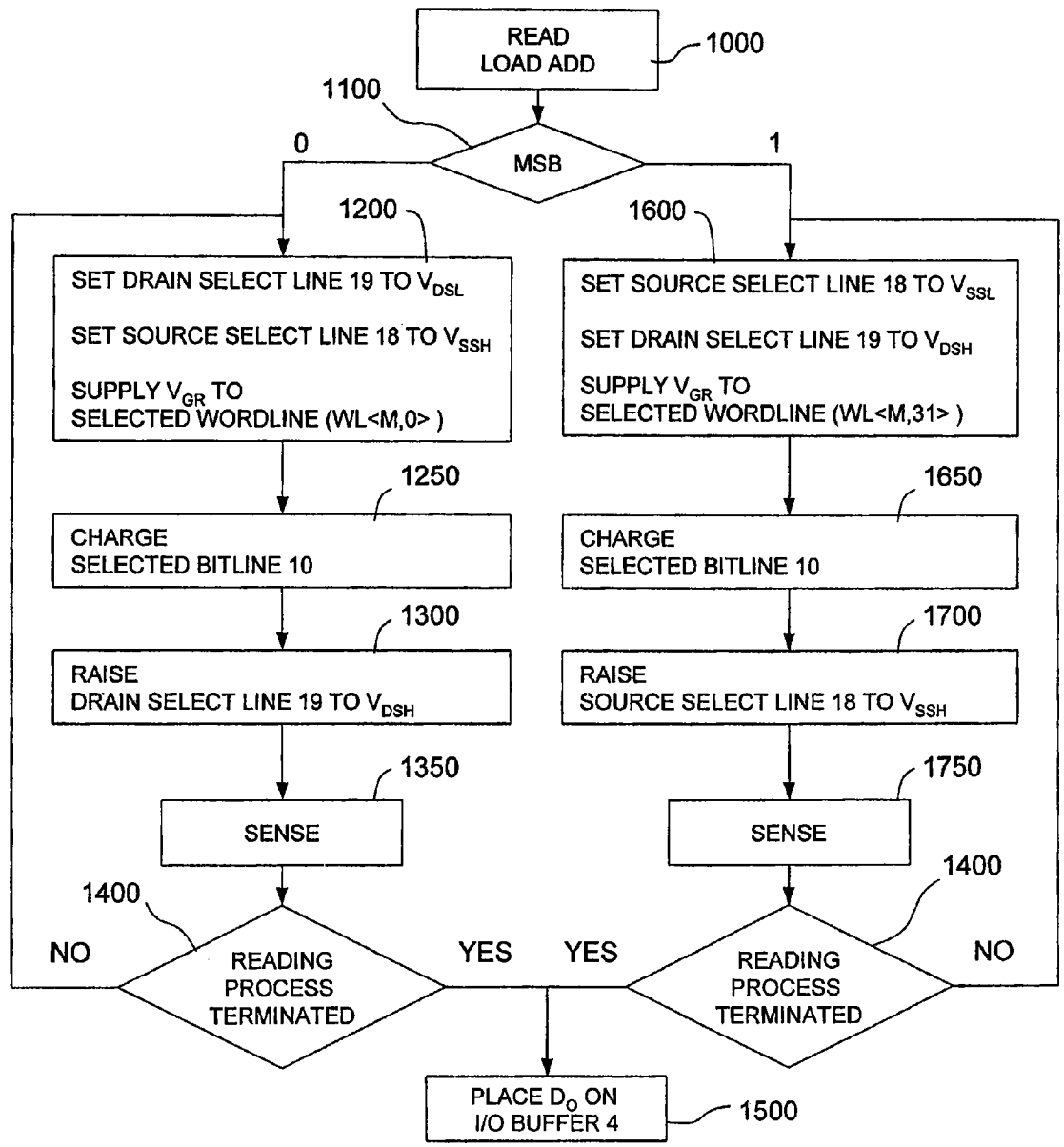
FIG. 9 is a flow chart relating to the method according to an embodiment of the present invention.
Figure 10:
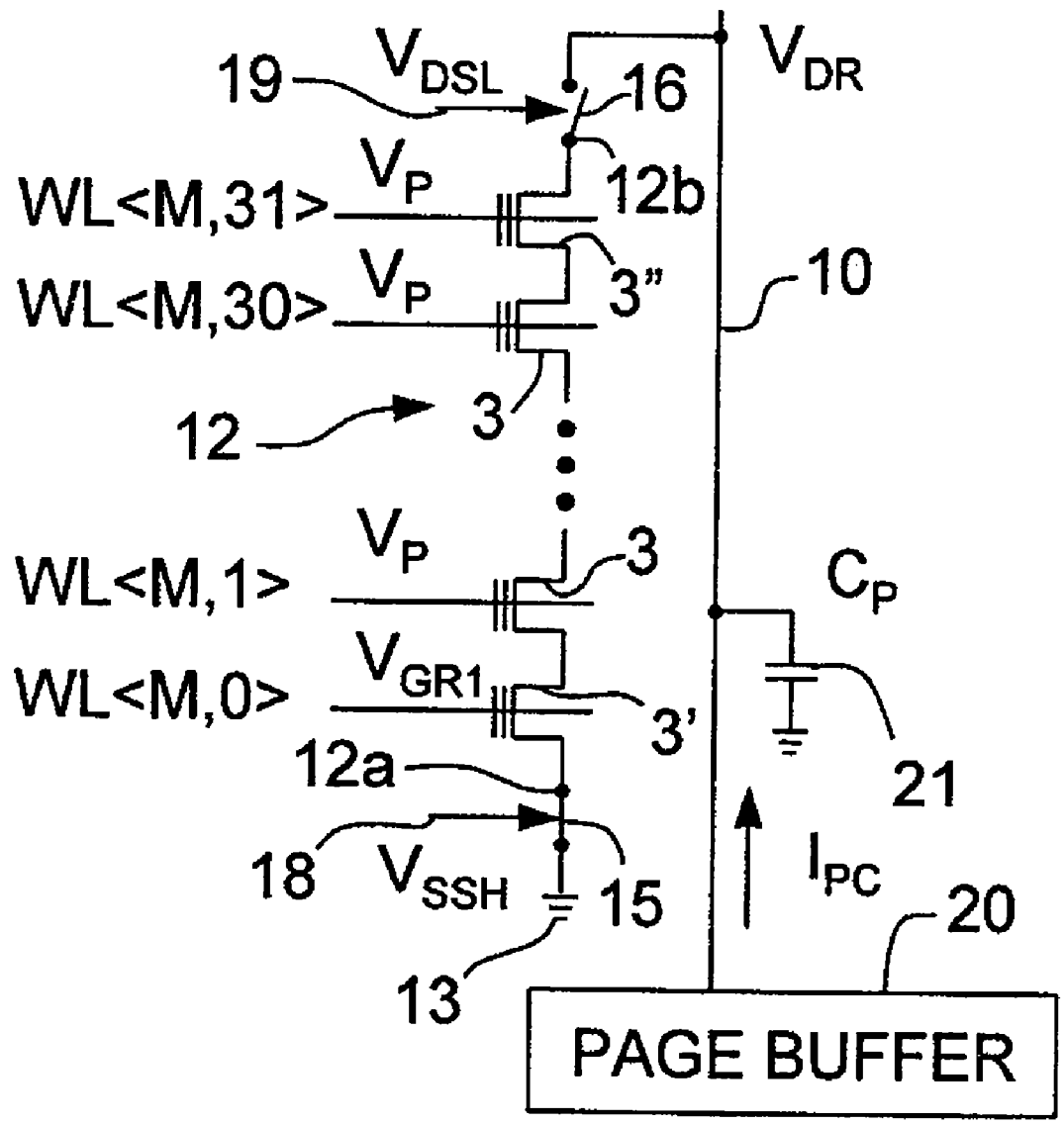
FIGS. 10-13 are simplified electric diagrams of a portion of the NAND memory device of FIG. 6, in different operating conditions.
Figure 11:
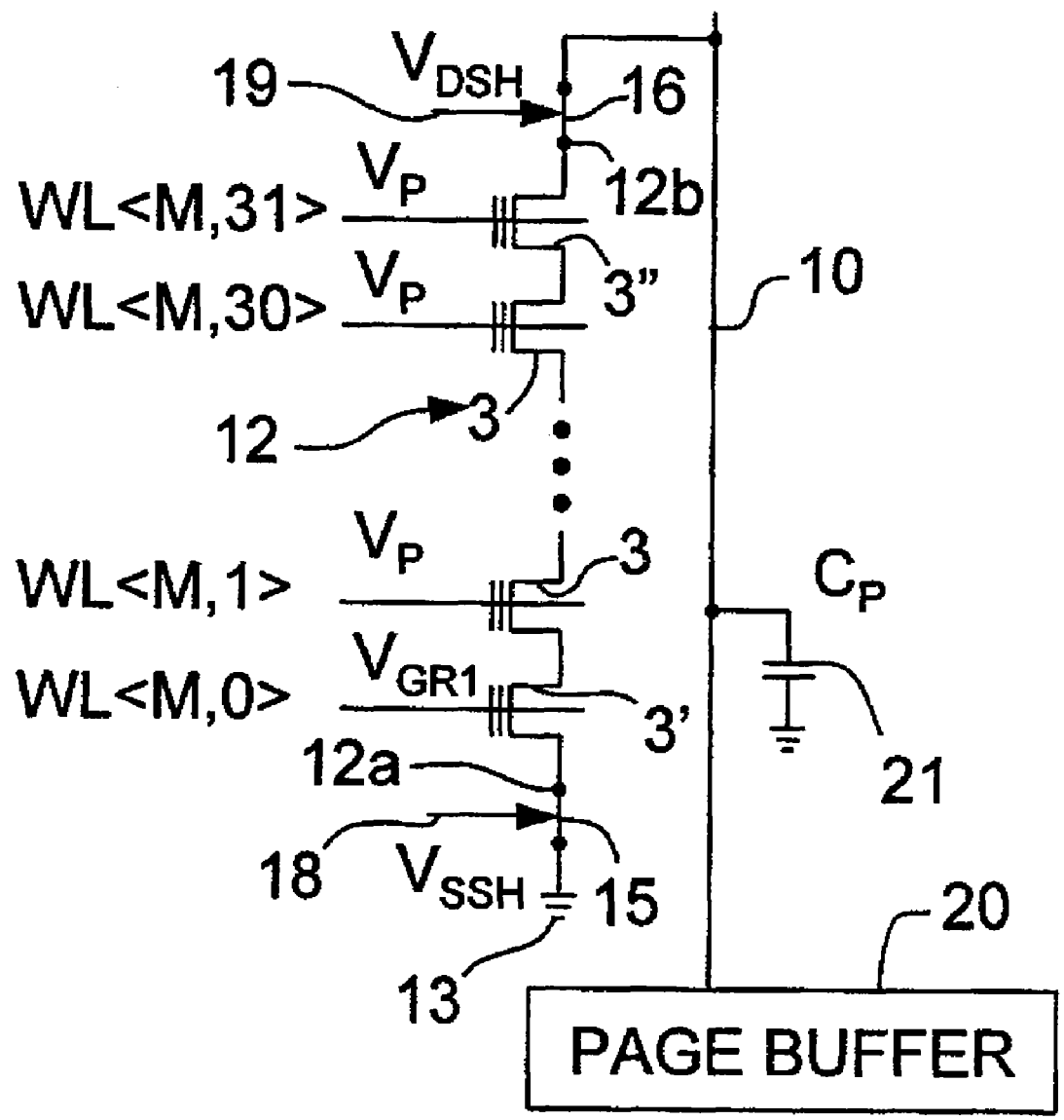

The first case is illustrated in FIGS. 10 and 11 and corresponds to exit "0" from block 1100 of FIG. 9. In the example herein illustrated, we will assume that the selected cell is the first cell 3', having its gate terminal coupled to the wordline WL<M,0> which is arranged adjacent to the source select line 18 (the source terminal of the first cell 3' forms the first end terminal 12a of the stack 12). However, operation of the NAND memory 100 is the same for the cells 3 coupled to any of the wordlines in the group WL<M,0>, ..., WL<M,15>.

The drain selector 16 is switched off by supplying a low drain select voltage $V_{DSL}$ on the drain select line 19 (block 1200, FIG. 9; see also FIG. 10). Additionally, the source select line 18 is raised to a high source select voltage $V_{SSH}$ and the source selector 15 is therefore on. Thus, the stack 12 is decoupled from the respective bitline 10, although its first end terminal 12a is connected to the ground line 13. At the same time, the selected wordline WL<M,0> is supplied with an appropriate voltage. For example, in an initial reading step, the wordline WL<M,0> is set at the gate read voltage $V_{GR1}$. Although the wordline WL<M,0> may experience a voltage swing at this stage, due to capacitive coupling with the source select line 18, there is not any risk of reading errors, because the drain selector 16 is off and no current may flow through the stack 12. All the other wordlines WL<M,1>, ..., WL<M,31> of the stack 12 receive the pass voltage $V_P$, which is so high as to turn on the corresponding cells 3 irrespective of their programming state, as already explained (e.g., $V_P$=5.5 V). Hence, the deselected cells 3 in the stack 12 are operated as pass gates.

Then (block 1250, FIG. 9; FIG. 10), the page buffer circuit 20 corresponding to the selected bitline 10 is operated to supply a precharge current $I_{PC}$, until the parasitic capacitor 21 associated to the selected bitline 10 is charged to a pre-determined drain read voltage $V_{DR}$.

When the precharge step is over and any possible transients caused by switching on the source selector 15 have expired, the drain select line 19 is raised to a high drain select voltage $V_{DSH}$, for switching on also the drain selector 16 and connecting the second end terminal 12b of the stack 12 to the selected bitline 10 (FIG. 11 and block 1300 in FIG. 9). Thus, if the selected first cell 3' is in a programming state associated with a threshold voltage $V_T$ lower than the gate read voltage $V_{GR1}$ (in this case the erased state), the first cell 3' sinks the charge stored on the parasitic capacitor 21 and the voltage on the selected bitline 10 falls. Otherwise, the selected first cell 3' is cut off and the bitline 10 remains at the drain read voltage $V_{DR}$. The drain select line 19 is capacitively coupled to the wordline WL<M,31>, because they run parallel and close to one another. However, possible voltage swings on the wordline WL<M,31> at this stage only have negligible effects, because the second cell 3", which is connected to the wordline WL<M,31>, is operated as a pass gate. Therefore, current passage through the stack 12 is not affected.

The voltage level on the selected bitline 10 is then sensed by the page buffer circuit 20 (block 1350).

If the reading process is terminated (exit YES from block 1400), output data $D_O$ is placed on the I/O buffer 4 through the column decoder circuit 6 (block 1500), otherwise (exit NO from block 1400) steps corresponding to blocks 1200-1350 are repeated, and a different gate read voltage $V_{GR1}$, $V_{GR2}$, $V_{GR3}$ is used. The reading process is deemed terminated when the threshold voltage $V_T$ of the selected first cell 3' has been determined (for example, when the all possible gate read voltages $V_{GR1}$, $V_{GR2}$, $V_{GR3}$ has been used, or when the selected bitline 10 is discharged).

Figure 12:
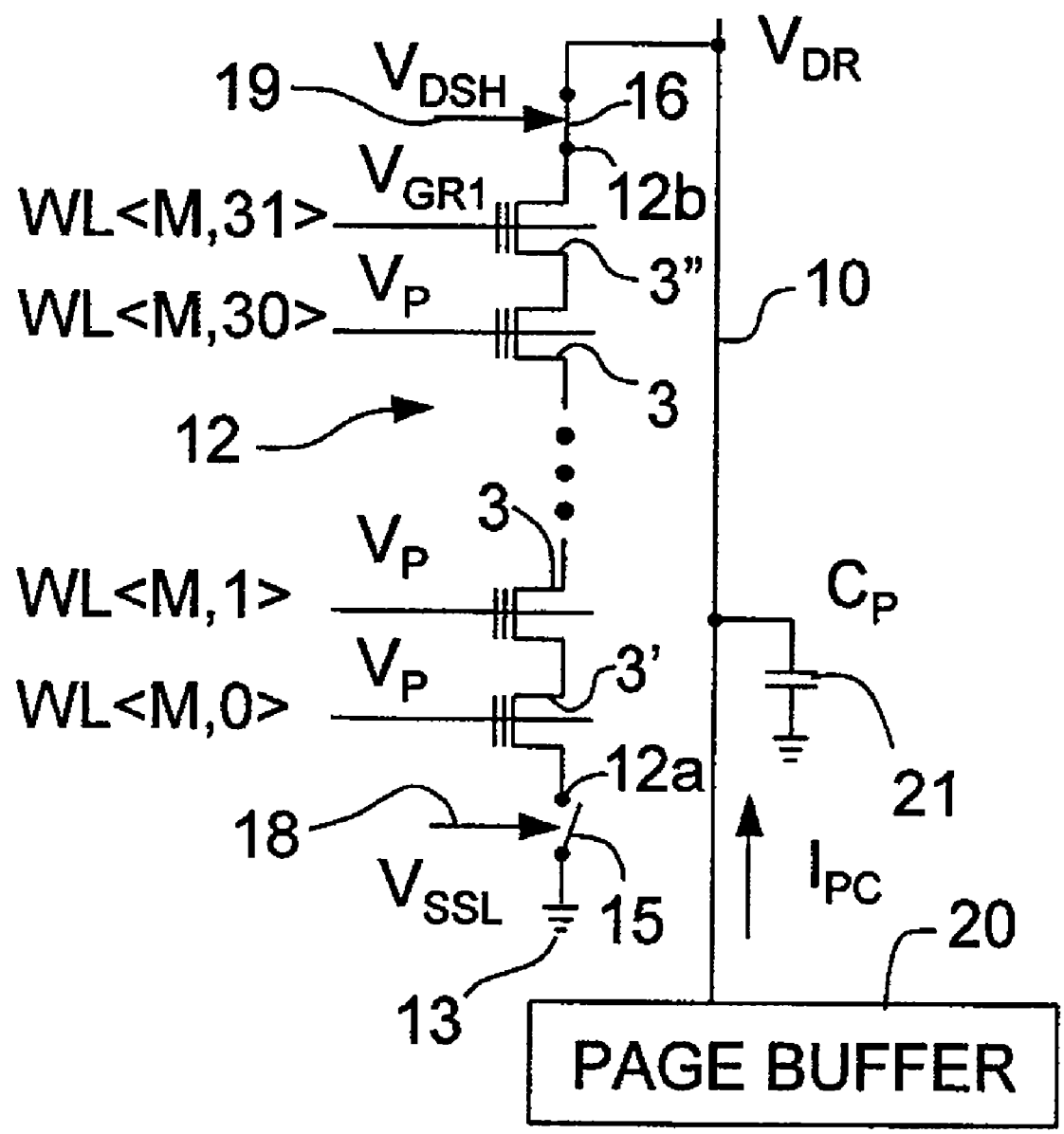
Figure 13:
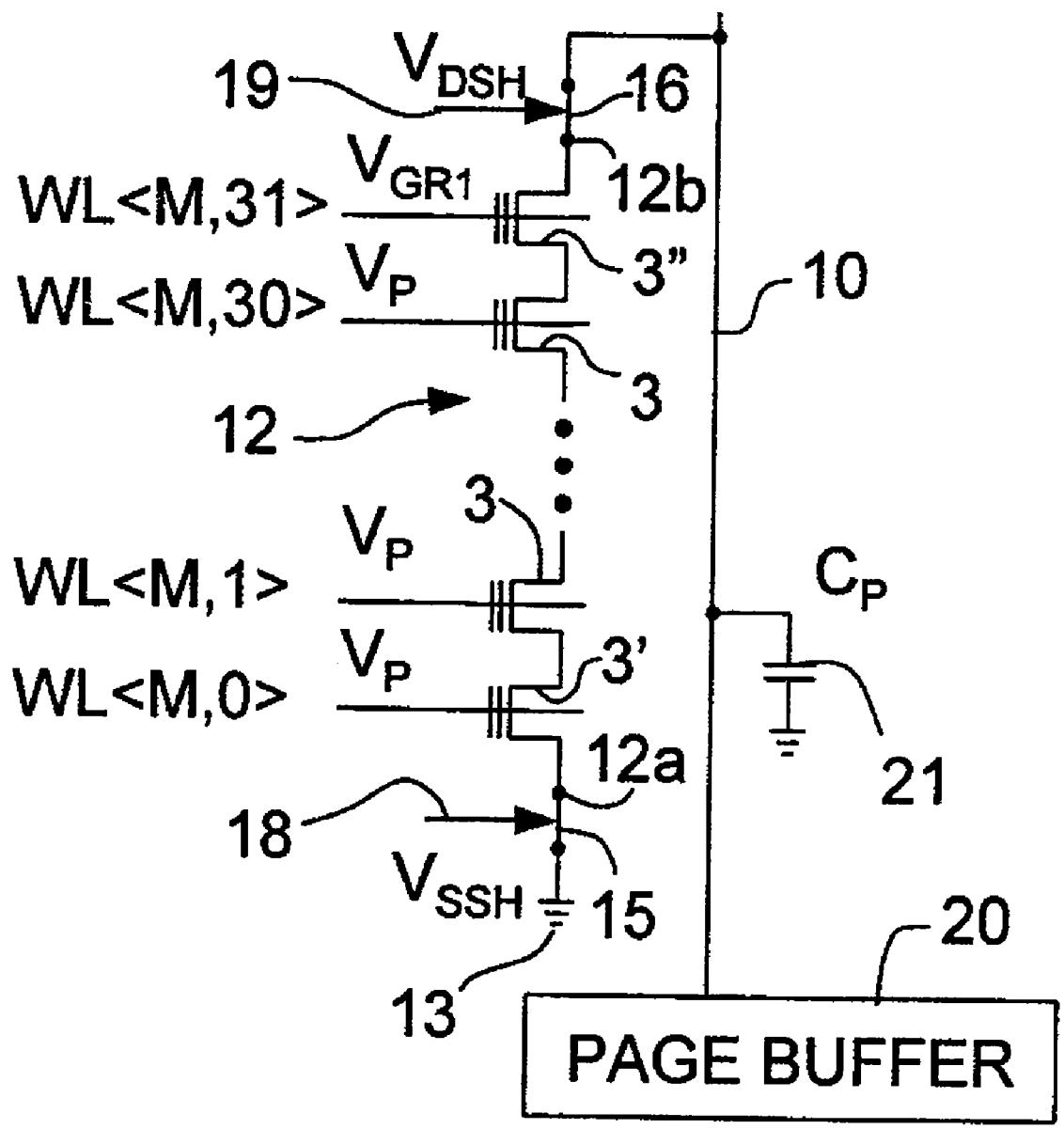

The case where the selected cell is coupled to a wordline in the group WL<M,16>, ..., WL<M,31> (MSB=1) is illustrated in FIGS. 12 and 13 and corresponds to exit "1" from block 1100 of FIG. 9. In the example herein illustrated, we will assume that a selected cell is the second cell 3", having its gate terminal coupled to the wordline WL<M,31> which is arranged adjacent to the drain select line 19 (the drain terminal of the second cell 3" forms the second end terminal 12b). However, operation of the NAND memory 100 is the same for the cells 3 coupled to any of the wordlines in the group WL<M,16>, ..., WL<M,31>.

The first end terminal 12a of the stack 12 is decoupled from the ground line 13 by setting the source select line 18 to a low source select voltage $V_{SSL}$ (block 1600, FIG. 9; FIG. 12), thereby switching off the source selector 15. On the contrary, the drain select line 19 is supplied with the high drain select voltage $V_{DSH}$ and the drain selector 16 is on. At the same time, the wordline WL<M,31> coupled to the selected second cell 3" is supplied with an appropriate read voltage, for example, the gate read voltage $V_{GR1}$, again. All the other wordlines WL<M,0>, ..., WL<M,30> of the stack 12 receive the pass voltage $V_P$, so they are operated as pass gates.

Then (block 1650, FIG. 9; FIG. 12), the page buffer circuit 20 corresponding to the selected bitline 10 is operated to supply a precharge current $I_{PC}$, until the parasitic capacitor 21 associated to the selected bitline 10 is charged to the drain read voltage $V_{DR}$.

When the precharge step is over, the source select line 18 is raised to the high source select voltage $V_{SSH}$, for switching on the source selector 15 and connecting the stack 12 to the ground line 13 (FIG. 13 and block 1700 in FIG. 9). Thus, if the selected second cell 3" is in a programming state associated with a threshold voltage $V_T$ lower than the gate read voltage $V_{GR1}$ (in this case the erased state), the second cell 3" sinks the charge stored on the parasitic capacitor 21 and the voltage on the selected bitline 10 falls. Otherwise, the selected second cell 3" is cut off and the bitline 10 remains at the drain read voltage $V_{DR}$.

The voltage level on the selected bitline 10 is sensed by the page buffer circuit 20 (block 1750).

If the reading process is terminated (exit YES from block 1400), output data $D_O$ is placed on the I/O buffer 4 through the column decoder circuit 6 (block 1500), otherwise (exit NO from block 1800) steps corresponding to blocks 1600-1750 are repeated, and a different gate read voltage $V_{GR1}$, $V_{GR2}$, $V_{GR3}$ is used.

The above described process prevents any possible reading errors due to capacitive coupling of adjacent conductive lines, especially when a wordline is involved, that is arranged adjacent to a source select line or to a drain select line. Based on the wordline address section AWL (namely the most significant bit MSB), in fact, the command interface logic 102 determines an order of switching on the first selector 15 and the second selector 16, thereby determining also an order of connecting the first end terminal 12a to the ground line 13 and of connecting the second end terminal 12b to the selected bitline 10. In particular, when the selected cell is the first cell 3' (FIGS. 10 and 11), the first selector 15 is switched on before the second selector 16 and before charging the selected bitline 10. Thus, the source select line 18 is raised to the high source select voltage $V_{SSH}$ before charging the selected bitline 10 as well, and then is kept constant. On the contrary, when the selected cell is the second cell 3" (FIGS. 12 and 13), the second selector 16 is switched on before the first selector 15 and before charging the selected bitline 10. Thus, the drain select line 19 is raised to the high drain select voltage $V_{DSH}$ before charging the selected bitline 10 as well, and then is kept constant. Therefore, the wordline involved in biasing the selected cell, either the wordline WL<M,0> for biasing the first cell 3' or the wordline WL<M,31> for biasing the second cell 3" in the worst cases, is arranged remote from the conductive line which is raised later (more precisely, the wordline WL<M,0> is remote from the drain select line 19 and the wordline WL<M,31> is remote from the source select line 18). In general, any wordline WL<M,0>, WL<M,1>, . . . , WL<M,31>, which is involved in biasing a selected cell 3, is always arranged far away from the later of the source selector 15 and the drain selector 16 to switch on. Hence, at the time when the charge stored on the bitline 10 is in condition of being transferred toward the ground line 13, depending on the programming state of the first cell 3' (FIG. 11), of the second cell 3" (FIG. 13) or of any other selected cell 3, capacitive coupling cannot cause any voltage swing on the gate terminal of the selected cell 3, 3', 3" itself. In other words, rapidly modifying the voltage level on the source select line 18 and the drain select line 19 actually causes voltage swings on the adjacent wordlines WL<M,0> and WL<M,31> due to capacitive coupling. However, the first of the source select line 18 and the drain select line 19 to switch does not produce any remarkable effect, because no current may flow through the stack 12, and the later only causes a voltage swing on the gate terminal of a deselected cell, which is being operated as a pass gate. Reading errors are therefore prevented.

According to the above described embodiment, moreover, only one address bit (i.e., the most significant bit MSB of the wordline address section AWL) is required for appropriate control.

However, any number of address bits may be used, provided that the source selector 15 is switched on first, when the selected cell is coupled to the wordline WL<M,0> adjacent to the source select line 18, and the drain selector 16 is switched first, when the selected cell is coupled to the wordline WL<M,31> adjacent to the drain select line 19.

Figure 14:
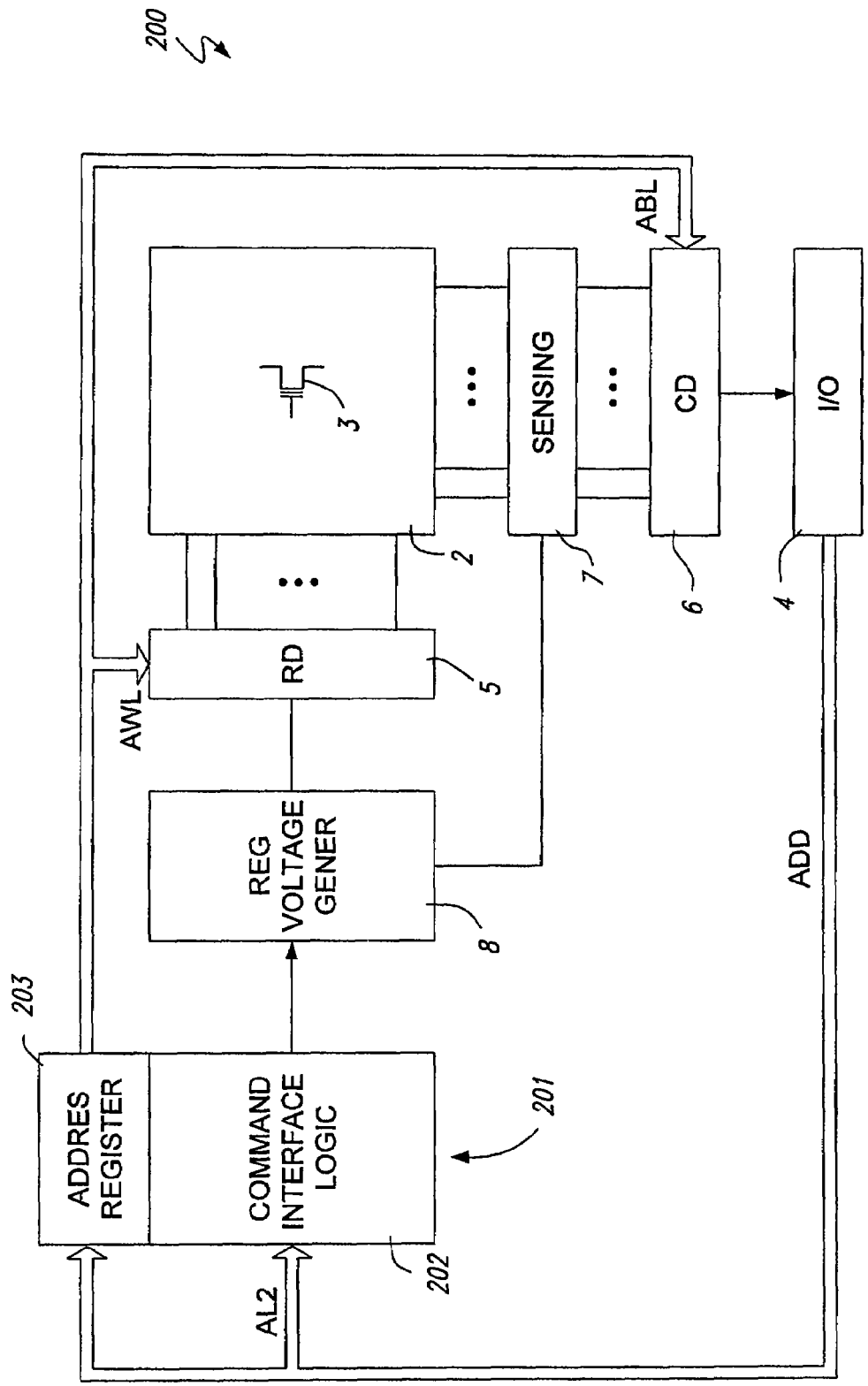
FIG. 14 is a simplified block diagram of a NAND memory device according to another embodiment of the present invention.
Figure 15:
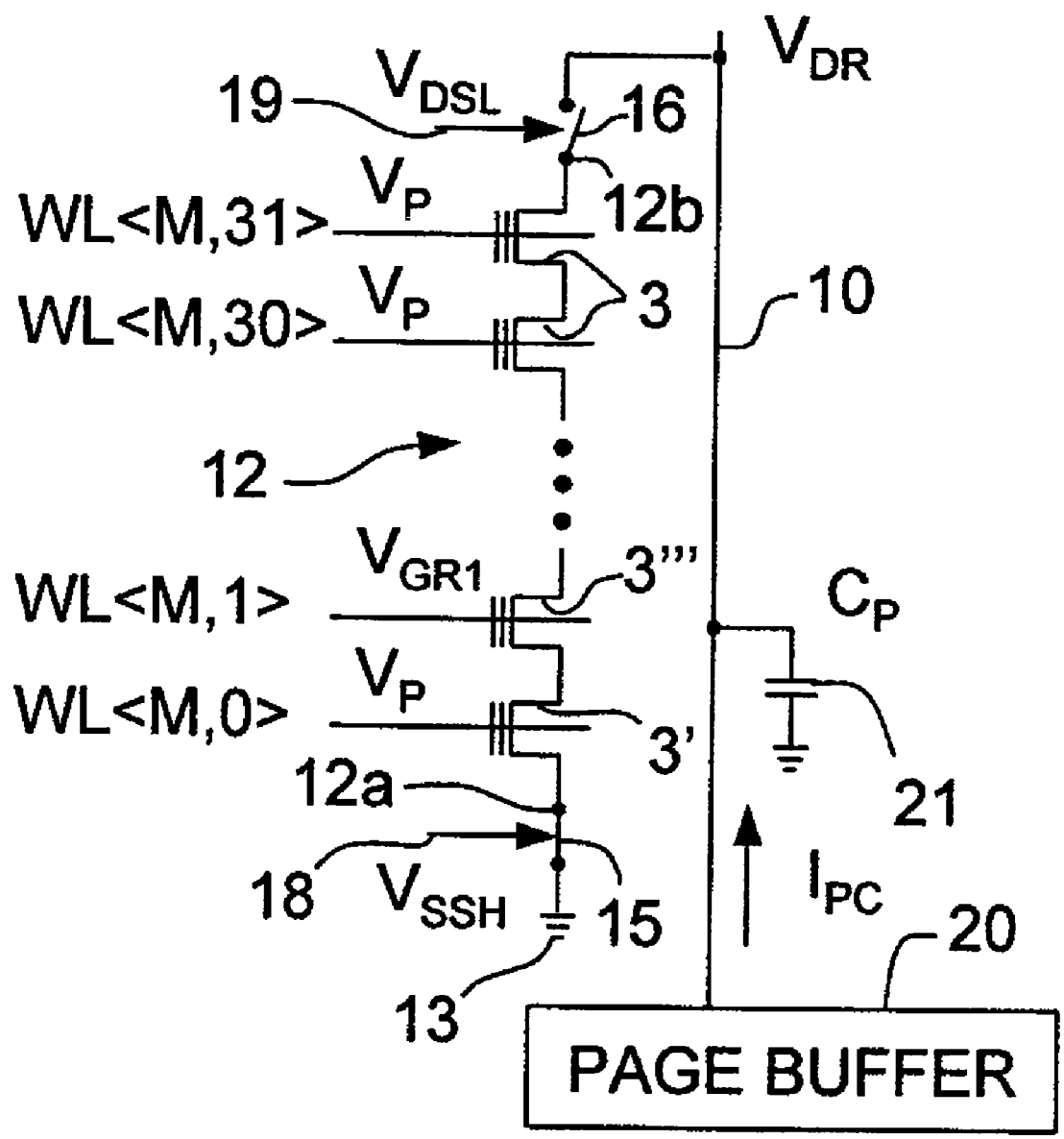
FIGS. 15 and 16 are simplified electric diagrams of a portion of the NAND memory device of FIG. 6, in different operating conditions.
Figure 16:
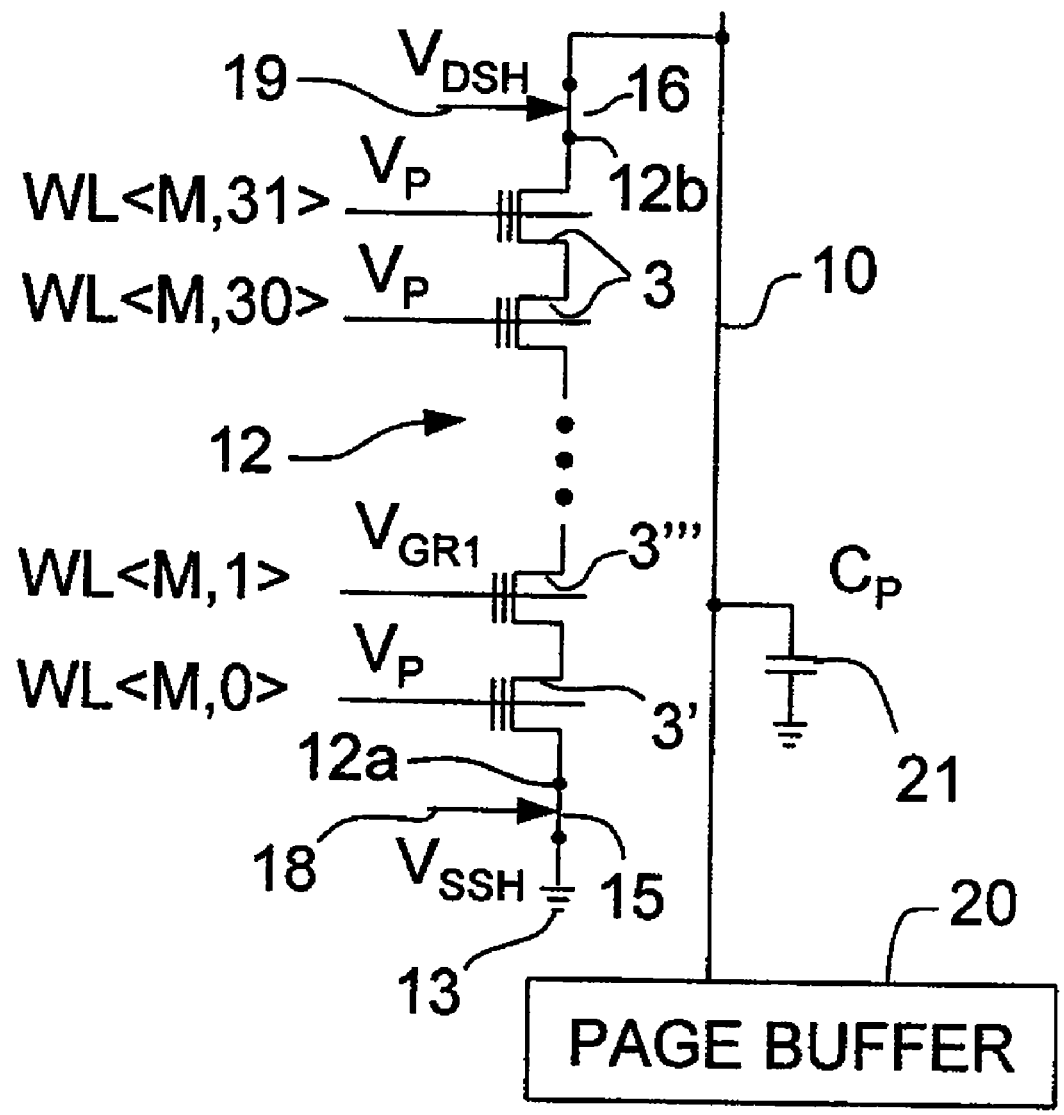

According to a different embodiment, illustrated in FIGS. 14-16, the whole wordline address section AWL of the address ADD is supplied to a command interface logic command 202 of a control unit 201. In this case, the source selector 15 is turned on before the drain selector only when the selected cell 3' is coupled to the wordline WL<M,0> adjacent to the source select line 18 (thus, the same operating conditions are established as already illustrated in FIGS. 10 and 11). On the contrary, when a cell 3''' is selected, that is connected to any one of the wordlines WL<M,1>, . . . , WL<M,31> (WL<M,1> in the example of FIGS. 15 and 16), the drain selector 19 is turned on before the source selector 18. Voltage swing on the wordline WL<M,0>, WL<M,1>, . . . , WL<M,31> coupled to the selected cell 3 is anyway avoided.

Figure 17:
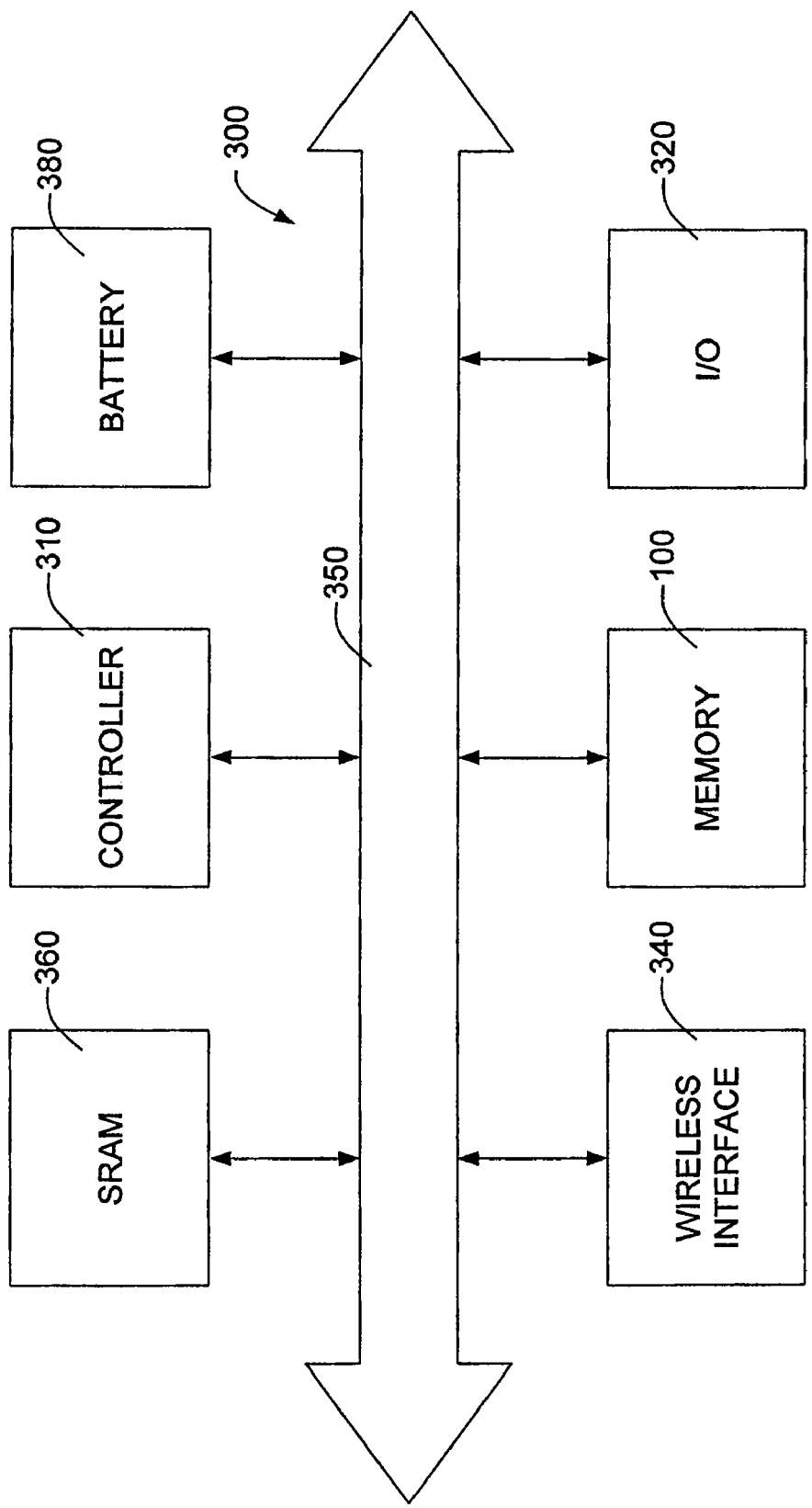
FIG. 17 is a system depiction of one embodiment of the present invention.

In FIG. 17, a portion of a system 300 in accordance with an embodiment of the present invention is described. System 300 may be used in devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information either wirelessly or over a wire connection. System 300 may be used in any of the following systems: a wireless local area network (WLAN) system, a wireless personal area network (WPAN) system, or a cellular network, although the scope of the present invention is not limited in this respect.

System 300 may include a controller 310, an input/output (I/O) device 320 (e.g., a keypad, display), the NAND memory 100 of FIG. 6, a wireless interface 340, and a static random access memory (SRAM) 360 and coupled to each other via a bus 350. In another embodiment, the NAND memory 200 of FIG. 14 may be included. A battery 380 may supply power to the system 300 in one embodiment. It should be noted that the scope of the present invention is not limited to embodiments having any or all of these components.

Controller 310 may comprise, for example, one or more microprocessors, digital signal processors, micro-controllers, or the like. The NAND memory 100 may be used to store messages transmitted to or by system 300. The NAND memory 100 may also optionally be used to store instructions that are executed by controller 310 during the operation of system 300, and may be used to store user data either generated or collected or received by system 300 (such as image data). The instructions may be stored as digital information and the user data, as disclosed herein, may be stored in one section of the memory as digital data and in another section as analog memory. As another example, a given section at one time may be labeled as such and store digital information, and then later may be relabeled and reconfigured to store analog information.

The I/O device 320 may be used to generate a message. The system 300 may use the wireless interface 340 to transmit and receive messages to and from a wireless communication network with a radio frequency (RF) signal. Examples of the wireless interface 340 may include an antenna, or a wireless transceiver, such as a dipole antenna, although the scope of the present invention is not limited in this respect. Also, the I/O device 320 may deliver a voltage reflecting what is stored as either a digital output (if digital information was stored), or as analog information (if analog information was stored).

While an example in a wireless application is provided above, embodiments of the present invention may also be used in non-wireless applications as well.

Finally, it is clear that numerous modifications and variations may be made to the method and the memory device described and illustrated herein, all falling within the scope of the invention, as defined in the attached claims.

In particular, it is clear that stacks may comprise any suitable number of cells 3. Moreover, any number of address bits may be used to determine the order of switching on the first selector 15 and the second selector 16.

The invention claimed is:

1. A reading method of a NAND memory device comprising the steps of:
   electrically connecting a first end terminal of a stack of cells to a reference line;
   electrically connecting a second end terminal of said stack of cells to a respective bitline;
   charging said bitline to a bitline read voltage, wherein one of said connecting steps is carried out before charging said bitline and the other of said connecting steps is carried out after charging said bitline; and
   determining an order of carrying out said connecting steps, based on an address of a selected cell.

2. The method according to claim 1, wherein said order is determined such that said connecting the first end terminal is carried out before said connecting the second end terminal at least when said selected cell is a first cell having a conduction terminal forming said first end terminal.

3. The method according to claim 2, wherein said order is determined such that said connecting the second end terminal is carried out before said connecting the first end terminal at least when said selected cell is a second cell having a conduction terminal forming said second end terminal.

4. The method according to claim 1, wherein said step of determining comprises testing a section of said address of said selected cell.

5. The method according to claim 4, wherein said testing step comprises testing a single bit of said address of said selected cell.

6. The method according to claim 1, further comprising the step of sensing a voltage level on said bitline.

7. The method according to claim 1, wherein said stack of cells include nonvolatile multilevel memory cells, capable of storing at least two bits each.

8. The method according to claim 1, wherein said stack of cells include nonvolatile single level memory cells, capable of storing one bit each.

9. A NAND memory device comprising:
   a stack of cells, said stack having a first end terminal, selectively connectable to a reference line, and a second end terminal, selectively connectable to a respective bitline;
   a sensing circuit coupled to said bitline and structured to charge said bitline to a bitline read voltage; and
   a control unit, wherein said control unit is configured to connect one of said end terminals before charging said bitline and the other of said end terminals after charging said bitline, said control unit being further configured to determine an order of connecting said end terminals, based on an address of a selected cell.

10. The NAND memory device according to claim 9, wherein said control unit is further configured to determine said order such that said first end terminal is connected to said reference line before connecting said second end terminal to said bitline at least when said selected cell is a first cell, a conduction terminal whereof forms said first end terminal.

11. The NAND memory device according to claim 10, wherein said control unit is further configured to determine said order such that said second end terminal is connected to said bitline before connecting said first end terminal to said reference line at least when said selected cell is a second cell, a conduction terminal whereof forms said second end terminal.

12. The NAND memory device according to claim 9, further comprising:
   a first selector, controlled by said control unit and configured to selectively connect said first end terminal of said stack of cells to said reference line; and
   a second selector, controlled by said control unit and configured to selectively connect said second end terminal of said stack of cells to said bitline.

13. The NAND memory device according to claim 9, further comprising an I/O module, wherein said control unit is coupled to said I/O module for receiving said address of said selected cell.

14. The NAND memory device according to claim 13, wherein said control unit is further configured to determine said order based on a section of said address of said selected cell.

15. The NAND memory device according to claim 14, wherein said control unit is further configured to determine said order based on a single bit of said address of said selected cell.

16. The NAND memory device according to claim 9, wherein said stack of cells include nonvolatile multilevel memory cells, capable of storing at least two bits each.

17. The NAND memory device according to claim 9, wherein said stack of cells include nonvolatile single level memory cells, capable of storing one bit each.

18. A system comprising:
   a processing unit;
   an interface coupled to said processing unit; and
   a nonvolatile NAND memory device coupled to said processing unit, the nonvolatile NAND memory device including
      a stack of cells, said stack having a first end terminal, selectively connectable to a reference line, and a second end terminal, selectively connectable to a respective bitline,
      a sensing circuit coupled to said bitline and structured to charge said bitline to a bitline read voltage, and
      a control unit, wherein said control unit is configured to connect one of said end terminals before charging said bitline and the other of said end terminals after charging said bitline, said control unit being further configured to determine an order of connecting said end terminals, based on an address of a selected cell.

19. The system according to claim 18, wherein said interface is a wireless interface.

20. The system according to claim 18, wherein said control unit is further configured to determine said order such that said first end terminal is connected to said reference line before connecting said second end terminal to said bitline at least when said selected cell is a first cell, a conduction terminal whereof forms said first end terminal.

21. The system according to claim 20, wherein said control unit is further configured to determine said order such that said second end terminal is connected to said bitline before connecting said first end terminal to said reference line at least when said selected cell is a second cell, a conduction terminal whereof forms said second end terminal.

22. The system according to claim 18, wherein the nonvolatile NAND memory device further includes:
   a first selector, controlled by said control unit and configured to selectively connect said first end terminal of said stack of cells to said reference line; and a second selector, controlled by said control unit and configured to selectively connect said second end terminal of said stack of cells to said bitline.

23. The system according to claim 18, wherein the nonvolatile NAND memory device further includes an I/O module, wherein said control unit is coupled to said I/O module for receiving said address of said selected cell.

24. The system according to claim 23, wherein said control unit is further configured to determine said order based on a section of said address of said selected cell.

25. The system according to claim 24, wherein said control unit is further configured to determine said order based on a single bit of said address of said selected cell.

26. The system according to claim 18, wherein said stack of cells include nonvolatile multilevel memory cells, capable of storing at least two bits each.

27. The system according to claim 18, wherein said stack of cells include nonvolatile single level memory cells, capable of storing one bit each.

28. A NAND memory device comprising:
   first connecting means for connecting a first end terminal of a stack of cells to a reference line;
   second connecting means for connecting a second end terminal of said stack of cells to a respective bitline;
   charging means for charging said bitline to a bitline read voltage, wherein one of said first connecting and second connecting means operates before charging said bitline and the other of said first connecting and second connecting means operates after charging said bitline; and
   determining means for determining an order in which the first connecting means connects the first end terminal and the second connecting means connects the second end terminal, based on an address of a selected cell of said stack of cells.

29. The NAND memory device according to claim 28, wherein determining means is further based upon a section of said address of said selected cell.

30. The NAND memory device according to claim 28, wherein determining means is further based upon a single bit of said address of said selected cell.

* * * * *